United States Patent
Kobayashi

(10) Patent No.: US 8,506,712 B2
(45) Date of Patent: Aug. 13, 2013

(54) WAFER SUPPORT JIG, VERTICAL HEAT TREATMENT BOAT INCLUDING WAFER SUPPORT JIG, AND METHOD FOR MANUFACTURING WAFER SUPPORT JIG

(75) Inventor: Takeshi Kobayashi, Nishishirakawa (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 780 days.

(21) Appl. No.: 12/450,663

(22) PCT Filed: Apr. 14, 2008

(86) PCT No.: PCT/JP2008/000977
§ 371 (c)(1),
(2), (4) Date: Oct. 5, 2009

(87) PCT Pub. No.: WO2008/136181
PCT Pub. Date: Nov. 13, 2008

(65) Prior Publication Data
US 2010/0129761 A1    May 27, 2010

(30) Foreign Application Priority Data
May 1, 2007 (JP) .................................. 2007-120922

(51) Int. Cl.
*C23C 16/00* (2006.01)
(52) U.S. Cl.
USPC ........... 118/715; 118/725; 118/729; 118/724; 432/253; 156/345.52
(58) Field of Classification Search
None
See application file for complete search history.

(56) References Cited

U.S. PATENT DOCUMENTS
2007/0184397 A1    8/2007 Adachi

FOREIGN PATENT DOCUMENTS

| JP | A-4-6826 | 1/1992 |
|---|---|---|
| JP | A-9-283455 | 10/1997 |
| JP | A-11-340155 | 12/1999 |
| JP | A-2000-269150 | 9/2000 |
| JP | A-2002-43239 | 2/2002 |
| JP | B2-3328763 | 9/2002 |
| JP | A-2004-63617 | 2/2004 |
| JP | A-2006-315910 | 11/2006 |
| JP | A-2007-73923 | 3/2007 |
| JP | A-2007-77421 | 3/2007 |

OTHER PUBLICATIONS

Nov. 13, 2012 Notification of Reasons for Refusal issued in Japanese Patent Application No. 2007-120922 (w/ translation).

(Continued)

*Primary Examiner* — Robert Xu
(74) *Attorney, Agent, or Firm* — Oliff & Berridge, PLC

(57) ABSTRACT

The present invention provides a wafer support jig having at least a support surface on which a treatment target wafer is mounted and supported when performing a heat treatment, wherein skewness $R_{sk}$ on the support surface that supports the treatment target wafer is $0<R_{sk}<10$, and $10^0$ to $10^5$ protruding objects each having a height of 2 μm or above and less than 30 μm are present within arbitrary 1 mm$^2$ without protruding objects each having a height of 30 μm or above on the entire support surface. As a result, it is provided a wafer support jig that can reduce friction or adhesion of a support surface of the wafer support jig and the wafer when performing a heat treatment to the treatment target wafer such as a semiconductor wafer in a vertical heat treatment furnace, has an appropriate size distribution of the protruding objects on the support surface, and can suppress occurrence of slip dislocation, and to provide a vertical heat treatment boat including this wafer support jig, and a method for manufacturing the wafer support jig.

4 Claims, 7 Drawing Sheets

(56) References Cited

OTHER PUBLICATIONS

Oct. 4, 2012 Search Report issued in Taiwanese Patent Application No. 97114269 (with English Translation).

Oct. 16, 2012 Office Action issued in Taiwanese Patent Application No. 97114269 (with partial English Translation).

Office Action issued in Taiwanese Patent Application No. 97114269 dated Mar. 6, 2013 (with partial translation).

WAFER SUPPORT JIG, VERTICAL HEAT TREATMENT BOAT INCLUDING WAFER SUPPORT JIG, AND METHOD FOR MANUFACTURING WAFER SUPPORT JIG

TECHNICAL FIELD

The present invention relates to a wafer support jig that is used when performing a heat treatment to a treatment target wafer such as a semiconductor wafer and a vertical heat treatment boat including this wafer support jig, and more particularly to a wafer support jig and a vertical heat treatment boat which can suppress occurrence of slip dislocation in a treatment target wafer at the time of a heat treatment.

BACKGROUND ART

When using a semiconductor single crystal wafer, e.g., a silicon wafer to fabricate a device, many processes lie between a wafer processing process to a device forming process, and there is a heat treatment process as one of such processes. The heat treatment process is an important process that is performed for the purpose of forming a defect-free layer in a surface layer of a wafer, gettering, crystallization, formation of an oxide film, or diffusion of an impurity.

As a diffusion furnace (an oxidation/diffusion device) utilized in such a heat treatment process, e.g., oxidation or diffusion of an impurity, a vertical heat treatment furnace in which a heat treatment is performed with many wafers being horizontally supported at predetermined intervals is mainly used with an increase in diameter of wafers. Further, when using the vertical heat treatment furnace to perform a heat treatment to wafers, a vertical heat treatment boat (which may be simply referred to as a boat hereinafter in some cases) that is used to set many wafers is utilized.

FIG. 4 shows an outline of a conventional general vertical heat treatment boat 210. A pair of plate-like members (which will be also referred to as coupling members or a top plate and a bottom plate) 216 are coupled to both end portions of each of four support rods 214. Many slits 211 are formed on each support rod 214, and a convex portion between the respective slits 211 functions as a support portion 212 for wafers. When performing a heat treatment with respect to a treatment target wafer (which may be simply referred to as a wafer hereinafter), as shown in a plan view of FIG. 5(A) and a front view of FIG. 5(B), each wafer W is horizontally supported by mounting an outer peripheral portion of the wafer W on the support portions 212 formed at the same height of each support rod 214.

FIG. 6 is a schematic view showing an example of a vertical heat treatment furnace. Many wafers W are horizontally supported by a heat treatment boat 210 installed in a reaction chamber 222 of a vertical heat treatment furnace 220. At the time of a heat treatment, the wafers W are heated by a heater 224 provided around the reaction chamber 222. During the heat treatment, a gas is led into the reaction chamber 222 through a gas introducing pipe 226, flows from an upper side toward a lower side, and is discharged to the outside from a gas exhaust pipe 228. Although the gas to be utilized varies depending on a purpose of the heat treatment, $H_2$, $N_2$, $O_2$, or Ar is mainly used, for example. In case of impurity diffusion, each of these gases is also used as a carrier gas for an impurity compound gas.

Various kinds of shapes are adopted for the wafer support portions 212 in the vertical heat treatment boat 210, and each of FIGS. 7(A) and (B) shows an example. (A) shows an example in which concave slits (grooves) 211 are provided in each support rod 214 having a semi-cylindrical shape to form semi-circular support portions 212. On the other hand, (B) shows an example in which concave slits 211 are provided in each wide prismatic support rod 215 to form rectangular support portions 213 in order to support each wafer W at a position closer to the center thereof than (A). Besides, a slit shape may be a circular shape or a hook-like shape.

Further, rather than directly supporting the wafers W by such support portions 212 or 213, there is also a conformation that wafer support jigs are detachably disposed to the respective support portions 212 or 213 and the wafers W are mounted on and supported by the wafer support jigs.

A contact surface (a support surface) with respect to the wafer of the wafer support jig (or a support portion) that directly comes into contact with and supports such a treatment target wafer will now be described.

Japanese Unexamined Patent Publication (Kokai) No. H09-283455 has a description that a factor of stress concentration due to a weight of each wafer itself is removed by setting surface roughness Ra of the support surface to 0.5 μm or below to suppress slip.

On the other hand, Japanese Unexamined Patent Publication (Kokai) No. 2000-269150 has a description that the surface roughness Ra of the support surface is set to 0.3 μm or above since each wafer and the wafer support jig partially adhering to each other when the support surface is too smooth.

As explained above, to achieve both preventing stress concentration due to a weight of the wafer itself and preventing the wafer/wafer support jig from adhering, the surface roughness must be adjusted to fall within an optimum range, and the surface roughness is adjusted by a method such as a grinding process or a sandblast process.

However, even if a wafer support surface adjusted by such a method is used, slip cannot be suppressed when a thermal stress factor is increased by raising a temperature increase/temperature decrease rate at the time of a heat treatment or reducing a boat pitch. It can be considered that slip cannot be suppressed because of an influence of thermal deformation of the wafers or the wafer support jigs. When there is friction or adhesion between the wafers and the wafer support jigs, a stress that avoids thermal deformation is produced at the time of an increase or a decrease in temperature. It can be considered that, when a temperature increase/decrease rate is raised or when a boat groove pitch is reduced, alleviation of deformation due to such as slide of the wafers on the wafer support jigs caused by an increase in thermal deformation rate is no longer sufficient, and hence the stress increases, resulting in slip.

To reduce this stress, Japanese Patent Publication No. 3328763 discloses a method of reducing friction between each wafer and each wafer support jig by using a roller for the wafer support jig. However, there is a problem that accurately processing a concave portion in which the roller is mounted is difficult and a manufacturing cost for a boat is increased.

DISCLOSURE OF INVENTION

Thus, the present inventor has keenly studied about friction and adhesion of the support surface of the wafer support jig and the wafer, and the inventor has discovered that skewness ($R_{sk}$) on the support surface of the wafer support jig is one of important elements when reducing this friction/adhesion.

This $R_{sk}$ will now be explained.

For example, on the support surface of the wafer support jig formed by, e.g., grinding, small irregularities are actually present, and a cross section of the support surface describes an amplitude curve. $R_{sk}$ is a parameter indicating that this amplitude curve is skewed to which one of an upper side and a lower side in relation to an average line.

When a surface of the wafer support jig is processed by grinding or sandblasting to provide the support surface, since a streak or a dent is produced on the support surface, the amplitude curve is often biased above an average line as shown in, e.g., FIG. 2, and $R_{sk}$ takes a negative value.

On the other hand, as shown in FIG. 3, when the support surface has a shape like a pinholder, the amplitude curve is biased below the average line, and $R_{sk}$ takes a positive value.

Further, the present inventor has discovered that friction/adhesion of the wafer and the wafer support jig can be reduced and a high effect can be exercised to suppress slip dislocation by taking a positive value for $R_{sk}$ of the support surface with respect to the support surface that is formed by, e.g., conventional sandblasting and has $R_{sk}$ taking a negative value.

Furthermore, the present inventor has also discovered that, when $R_{sk}$ is too large conversely, contact between the wafer and the wafer support jig is extremely reduced, thereby stress concentration due to a weight of the wafer itself causes and slip occurs. That is, $R_{sk}$ has an optimum range.

Moreover, the present inventor has revealed the following matters in relation to adjustment of $R_{sk}$.

$R_{sk}$ can be adjusted by forming protruding objects on the support surface on purpose and controlling a density and a height of the protruding objects. Since an $R_{sk}$ value increases as a density of the protruding objects is reduced and a height of the protruding objects is increased, the density and the height of the protruding objects are adjusted so that an optimum $R_{sk}$ value can be obtained.

Additionally, a size distribution of the protruding objects must be also adjusted. When a protruding object that is extremely larger than other protruding objects is present, stress concentration due to a weight of the wafer itself occurs, and hence heights of relatively large protruding objects must be uniformed and these objects must be arranged with an appropriate density without an extremely large protruding object.

In view of the problems discovered by the present inventor, it is an object of the present invention to provide a wafer support jig that can reduce friction or adhesion of a support surface of the wafer support jig and a wafer, has an appropriate size distribution of protruding objects on the support surface, and can suppress occurrence of slip dislocation when performing a heat treatment to a treatment target wafer such as a semiconductor wafer in a vertical heat treatment furnace, a vertical heat treatment boat including this wafer support jig, and a method for manufacturing the wafer support jig.

To achieve this object, the present invention provides a wafer support jig having at least a support surface on which a treatment target wafer is mounted and supported when performing a heat treatment, wherein skewness $R_{sk}$ on the support surface that supports the treatment target wafer is $0<R_{sk}<10$, and $10^0$ to $10^5$ protruding objects each having a height of 2 μm or above and less than 30 μm are present within arbitrary 1 mm$^2$ without protruding objects each having a height of 30 μm or above on the entire support surface.

As explained above, according to the wafer support jig having at least the support surface on which the treatment target wafer is mounted and supported when performing a heat treatment, when the skewness $R_{sk}$ on the support surface that supports the treatment target wafer is $0<R_{sk}<10$, friction/adhesion of the wafer support jig and the treatment target wafer can be reduced on the support surface, and occurrence of slip dislocation caused due to this friction/adhesion can be effectively suppressed.

Further, since there is no protruding object having a height of 30 μm or above on the entire support surface and $10^0$ to $10^5$ protruding objects each having a height that is equal to or above 2 μm and less than 30 μm are present within arbitrary 1 mm$^2$, protruding objects having appropriate heights and density are present without a protruding object extremely larger than the other protruding objects, thereby avoiding stress concentration due to a weight of the treatment target wafer itself to be mounted and occurrence of slip dislocation caused due to this stress concentration. Furthermore, since the protruding objects having appropriate heights and density are present, $R_{sk}$ is adjusted to fall within the above-described range.

In this case, it is preferable that, in the wafer support jig having the protruding objects on the support surface, particles that become the protruding objects are dispersed and added in a base material that is etchable by using an etchant, and the protruding objects are formed by means of the dispersed and added particles on the support surface by etching the base material with the etchant.

When such a wafer support jig is provided, the base material is etched by the etchant, and the protruding objects are uniformly and easily formed on the support surface by means of the particles dispersed and added in the base material.

At this time, it is possible that the base material etchable with the etchant is quartz, and the dispersed and added particles are silicon carbide or silicon.

Moreover, it is possible that the etchant that is able to etch the base material is a liquid solution containing a hydrofluoric acid.

Additionally, it is possible that the base material etchable with the etchant is silicon, and the dispersed and added particles are silicon carbide, and the etchant that is able to etch the base material is a liquid solution containing a hydrofluoric acid and a nitric acid.

When the base material, the particles dispersed and added in the base material, and the etchant are as explained above, the desired protruding objects can be readily formed on the support surface of the wafer support jig.

Further, it is preferable that the wafer support jig having the protruding objects on the support surface has the protruding objects formed on the support surface by performing a heat treatment to a polycrystalline substance.

As explained above, when the polycrystalline substance is subjected to the heat treatment to form the protruding objects on the support surface, the protruding objects are uniformly and easily formed on the support surface of the wafer support jig.

At this time, it is possible that the heat treatment for the polycrystalline substance is performed in a reduced-pressure atmosphere, and that the heat treatment for the polycrystalline substance is performed in one of an atmosphere containing an inert gas, an atmosphere containing a hydrogen gas, and a mixed gas atmosphere containing these gases.

As explained above, when the heat treatment for the polycrystalline substance is performed in the reduced-pressure atmosphere and in one of the atmosphere containing the inert gas, the atmosphere containing the hydrogen gas, and the mixed gas atmosphere containing these gases, the desired protruding objects can be efficiently formed on the support surface of the wafer support jig.

Furthermore, it is possible that the polycrystalline substance to be subjected to the heat treatment is a polycrystalline substance of silicon or silicon carbide.

As explained above, when the polycrystalline substance to be subjected to the heat treatment is a polycrystalline substance of silicon or silicon carbide, the protruding objects can be easily formed on the support surface.

Further, the present invention provides a vertical heat treatment boat including the wafer support jig, having at least: a plurality of support rods; and a pair of plate-like members coupled with both end portions of each of the support rods, wherein a plurality of support portions to horizontally support the treatment target wafers are formed on each support rod, and the wafer support jigs on which the treatment target wafers are mounted and supported one by one are detachably disposed to the plurality of support portions.

According to such a vertical heat treatment boat, since the wafer support jigs on which the treatment target wafers are mounted and supported one by one are detachably disposed to the plurality of support portions that horizontally support the treatment target wafers, friction/adhesion of the wafer support jigs and the treatment target wafers can be reduced, and occurrence of slip dislocation can be effectively suppressed.

Furthermore, since the protruding objects having appropriate heights and density are present on the support surface without an extremely large protruding object on the support surface of the wafer support jig, stress concentration due to a weight of each treatment target wafer itself and occurrence of slip dislocation can be effectively prevented.

Moreover, the present invention provides a method for manufacturing a wafer support jig that mounts and supports a treatment target wafer on a support surface when performing a heat treatment, comprising: dispersing and adding particles that become protruding objects in a base material for the wafer support jig, etching the base material by using an etchant, and forming the protruding objects by means of the dispersed and added particles on the support surface; setting skewness $R_{sk}$ on the support surface to $0<R_{sk}<10$; and manufacturing a wafer support jig that has $10^0$ to $10^5$ protruding objects each having a height of 2 µm or above and less than 30 µm within arbitrary 1 mm² without protruding objects each having a height of 30 µm or above on the entire support surface.

According to such a method for manufacturing a wafer support jig, particles that become the protruding objects are dispersed and added in the base material for the wafer support jig, the base material is etched by the etchant, and the protruding objects are formed by means of the dispersed and added particles on the support surface, thereby the protruding objects can be uniformly and easily formed on the support surface.

Additionally, since the wafer support jig that has the skewness $R_{sk}$ on the support surface being set to $0<R_{sk}<10$ and has the $10^0$ to $10^5$ protruding objects each having a height that is equal to or above 2 µm and less than 30 µm within arbitrary 1 mm² without the protruding object having a height of 30 µm or above on the entire support surface is manufactured, friction/adhesion of the wafer support jig and the treatment target wafer can be reduced, occurrence of slip dislocation can be effectively suppressed, and the wafer support jig that can prevent stress concentration due to a weight of the treatment target wafer itself to be mounted and occurrence of slip dislocation due to this stress concentration can be obtained.

Further, according to this manufacturing method, the protruding objects are hardly detached after manufacture, and particle contamination can be prevented from occurring.

At this time, it is possible that the base material that is etched by using the etchant is quartz, and the dispersed and added particles are silicon carbide or silicon. And it is possible that the etchant that is used to etch the base material is a liquid solution containing a hydrofluoric acid.

Furthermore, it is possible that the base material that is etched by using the etchant is silicon, and the dispersed and added particles are silicon carbide. And it is possible that the etchant that is used to etch the base material is a liquid solution containing a hydrofluoric acid and a nitric acid.

When the base material, the particles dispersed and added in the base material, and the etchant are those described above, the desired protruding objects can be readily formed on the support surface of the wafer support jig.

Moreover, the present invention provides a method for manufacturing a wafer support jig on which a treatment target wafer is mounted and supported on a support surface when performing a heat treatment, comprising: performing a heat treatment to a polycrystalline substance that becomes a base material for the wafer support jig to form protruding objects on the support surface; setting skewness $R_{sk}$ on the support surface to $0<R_{sk}<10$; and manufacturing a wafer support jig that has $10^0$ to $10^5$ protruding objects each having a height of 2 µm or above and less than 30 µm within arbitrary 1 mm² without protruding objects each having a height of 30 µm or above on the entire support surface.

According to such a method for manufacturing a wafer support jig, the polycrystalline substance that becomes the base material for the wafer support jig is subjected to the heat treatment to form the protruding objects on the support surface, thereby the protruding objects can be uniformly and readily formed on the support surface.

Additionally, since the wafer support jig that has the skewness $R_{sk}$ on the support surface being set to $0<R_{sk}<10$ and has the $10^0$ to $10^5$ protruding objects each having a height that is equal to or above 2 µm and less than 30 µm within arbitrary 1 mm² without the protruding objects each having a height of 30 µm or above on the entire support surface is manufactured, friction/adhesion of the wafer support jig and the treatment target wafer can be reduced, occurrence of slip dislocation can be effectively suppressed, and the wafer support jig that can prevent stress concentration due to a weight of the treatment target wafer itself to be mounted and occurrence of slip dislocation due to this stress concentration can be obtained.

Further, particle contamination caused due to detachment of the protruding objects can be avoided.

At this time, it is possible that the heat treatment for the polycrystalline substance is performed in a reduced-pressure atmosphere, and the heat treatment for the polycrystalline substance is performed in one of an atmosphere containing an inert gas, an atmosphere containing a hydrogen gas, and a mixed gas atmosphere containing these gases.

As explained above, when the heat treatment for the polycrystalline substance is performed in the reduced-pressure atmosphere and in one of the atmosphere containing the inert gas, the atmosphere containing the hydrogen gas, and the mixed gas atmosphere containing these gases, the desired protruding objects can be efficiently formed on the support surface of the wafer support jig.

Further, it is possible that the polycrystalline substance to be subjected to the heat treatment is a polycrystalline substance of silicon or silicon carbide.

As explained above, when the polycrystalline substance that is subjected to the heat treatment is the polycrystalline substance of silicon or the silicon carbide, the protruding objects can be readily formed on the support surface.

Furthermore, the present invention provides a method for manufacturing a wafer support jig on which a treatment target wafer is mounted and supported on a support surface when performing a heat treatment, wherein particles that become protruding objects are dispersed and added in a base material for the wafer support jig, the base material is etched by using an etchant, and the protruding objects are formed by means of the dispersed and added particles on the support surface, or a heat treatment is performed to a polycrystalline substance that becomes the base material for the wafer support jig to form the protruding objects on the support surface, thereby the wafer support jig having the protruding objects on the support surface is manufactured.

According to such a method for manufacturing a wafer support jig, the particles that become the protruding objects are dispersed and added in the base material for the wafer support jig and the base material is etched by the etchant, and the protruding objects are formed by means of the dispersed and added particles on the support surface, or a heat treatment is performed to the polycrystalline substance that becomes the base material for the wafer support jig to form the protruding objects on the support surface, thereby the wafer support jig having the desired protruding objects uniformly and readily formed on the support surface is manufactured.

According to the wafer support jig and the vertical heat treatment boat of the present invention, friction or adhesion with respect to the treatment target wafer mounted on the support surface can be reduced, occurrence of stress concentration due to a weight of the treatment target wafer itself can be prevented, and slip dislocation can effectively be prevented from occurring in the treatment target wafer.

Moreover, according to the method for manufacturing a wafer support jig of the present invention, the protruding objects can be uniformly and readily formed on the support surface, the wafer support jig that can effectively prevent the above-described occurrence of slip dislocation can be obtained, and the protruding objects formed on the support surface are hardly detached, thereby suppressing occurrence of particle contamination.

BEST MODES FOR CARRYING OUT THE INVENTION

A wafer support jig, a vertical heat treatment boat including the wafer support jigs, and a method for manufacturing a wafer support jig according to the present invention will be explained in detail hereinafter with reference to the accompanying drawings, but the present invention is not restricted thereto.

Figure 1:
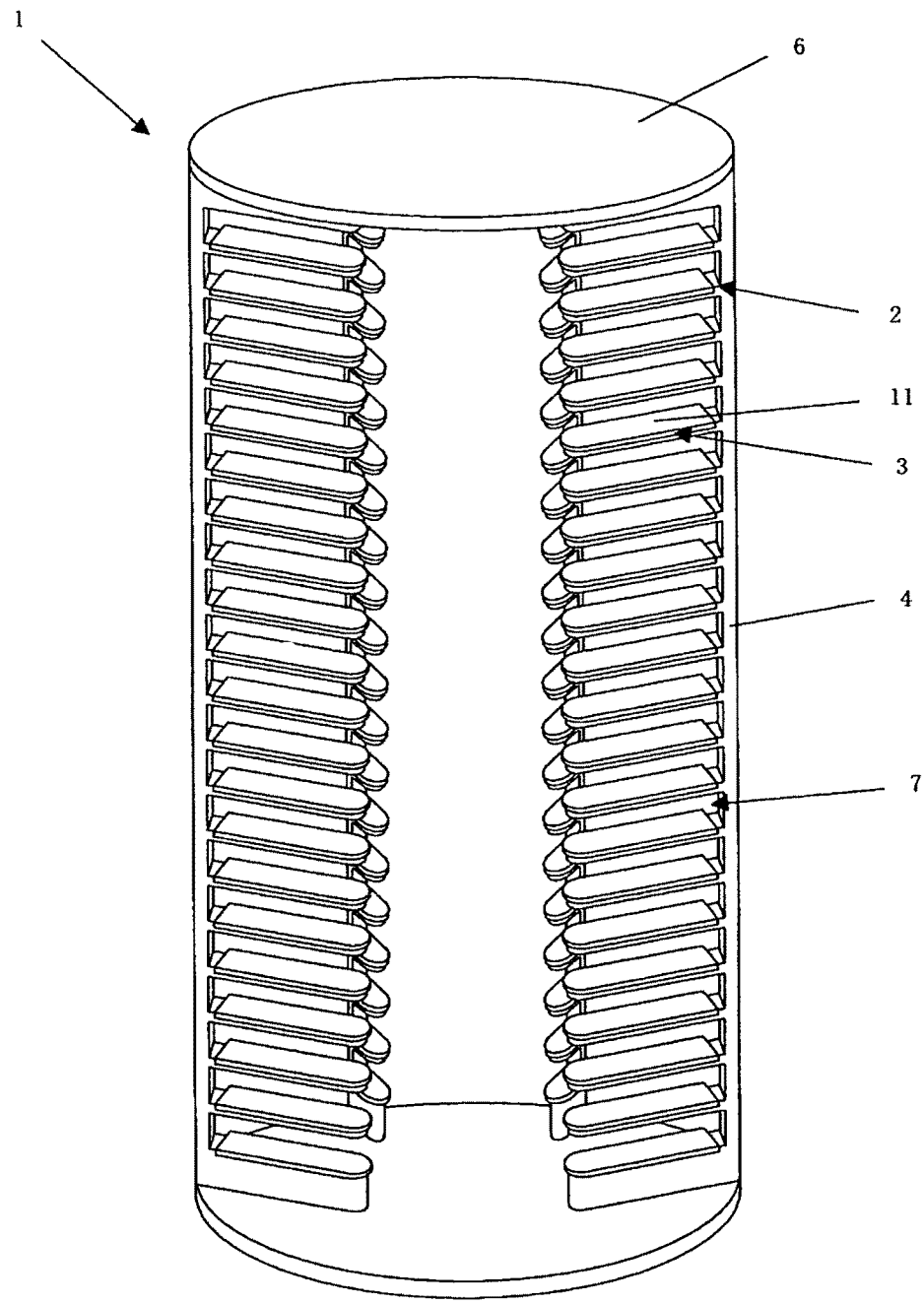
FIG. 1 is a schematic view showing an example of wafer support jigs and a vertical heat treatment boat according to the present invention.

FIG. 1 shows an outline of an example of wafer support jigs and a vertical heat treatment boat including the wafer support jigs according to the present invention.

This vertical heat treatment boat 1 has four support rods 4 and a pair of plate-like members 6 coupled with both end portions of each of the support rods 4. A plurality of slits (grooves) 7 are formed on each support rod 4 at positions having the same height at equal intervals, and a convex portion between the slits 7 functions as a support portion 2 for a semiconductor wafer. Further, in the vertical heat treatment boat 1 according to the present invention, a wafer support jig 3 as the present invention is detachably disposed to each support portion 2 of each support rod 4. When performing a heat treatment to wafers, the wafers are mounted one by one on the wafer support jigs 3 disposed to the support portions 2 having the same height on each support rod 4.

It is to be noted that the same structures as those in the conventional example except the wafer support jigs 3 can be adopted and they are not restricted in particular.

The wafer support jig 3 will now be described in more detail.

As a result of keenly studying a support surface of the wafer support jig, the present inventor has first discovered the following matters in relation to surface roughness of the support surface.

Figure 2:
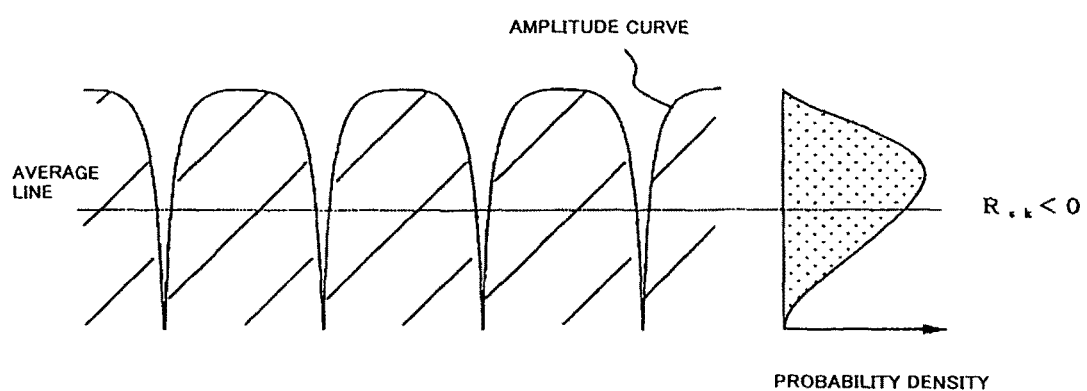
FIG. 2 is an explanatory drawing showing an example when $R_{sk}$ takes a negative value.
Figure 3:
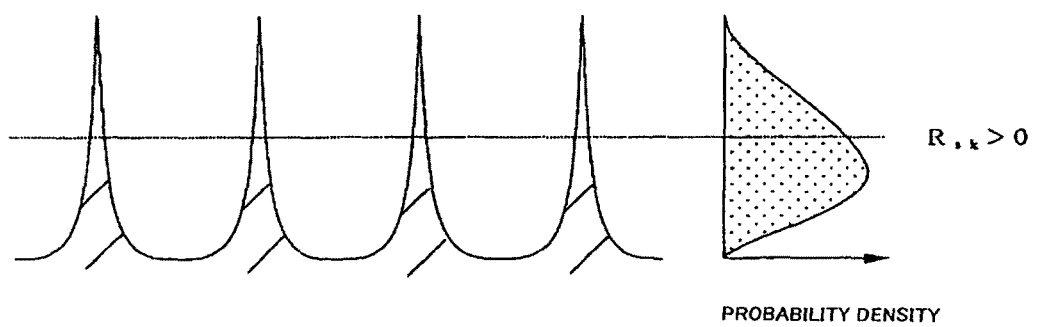
FIG. 3 is an explanatory drawing showing an example when $R_{sk}$ takes a positive value.
Figure 4:
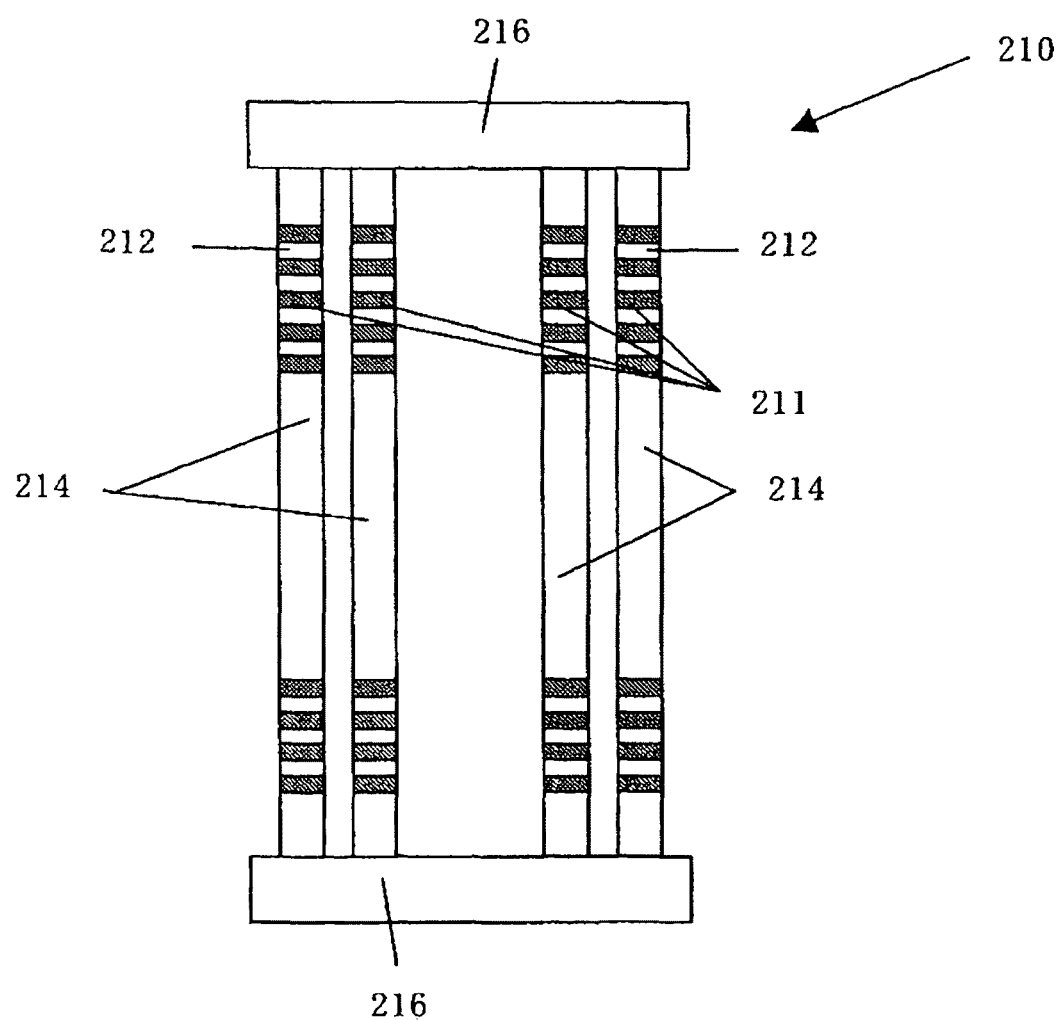
FIG. 4 is a schematic view showing an example of a conventional vertical heat treatment boat.
Figure 5:
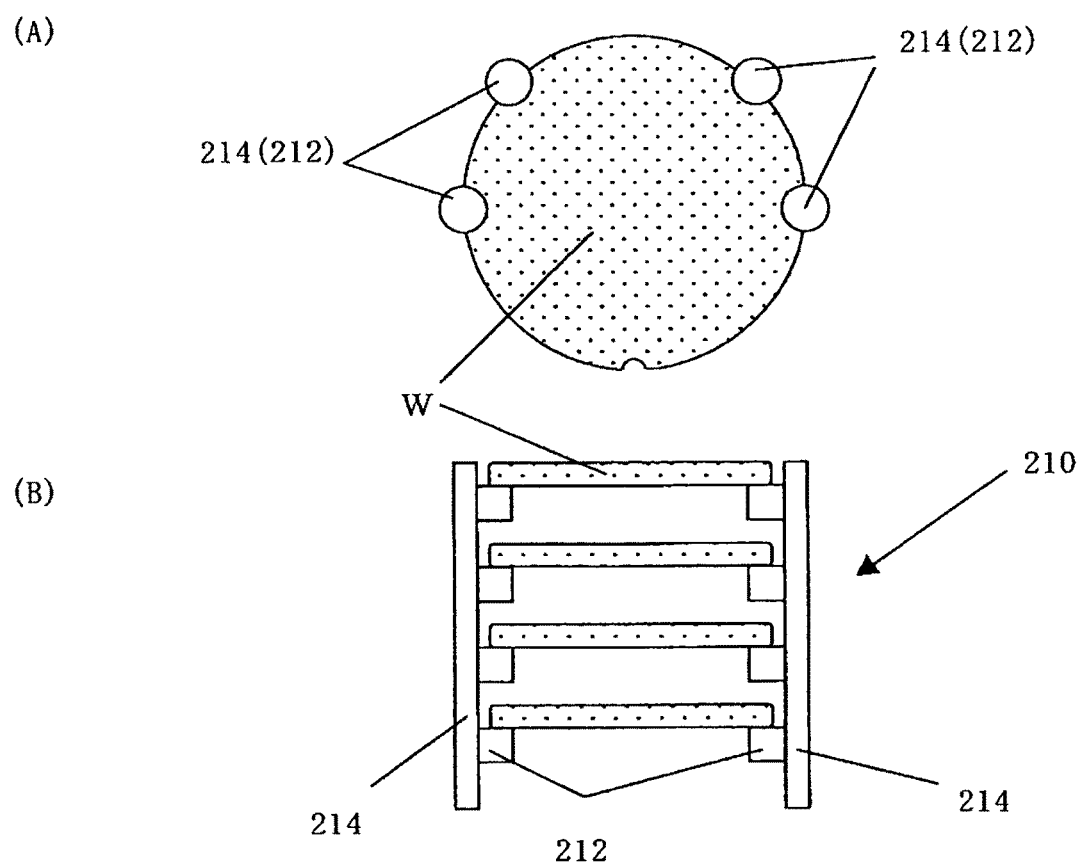
FIG. 5 is explanatory drawings showing a state that wafers are set in the conventional vertical heat treatment boat.
Figure 6:
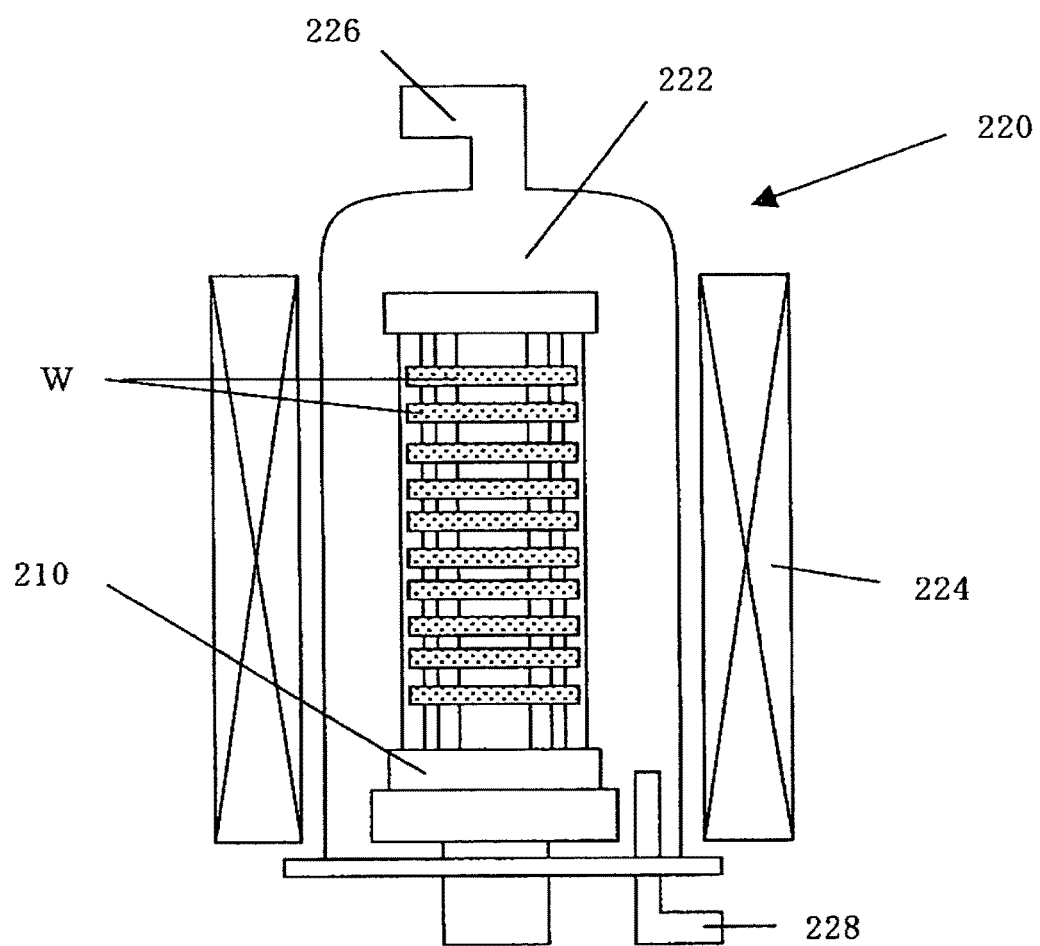
FIG. 6 is a schematic view showing an example of a vertical heat treatment furnace.
Figure 7:
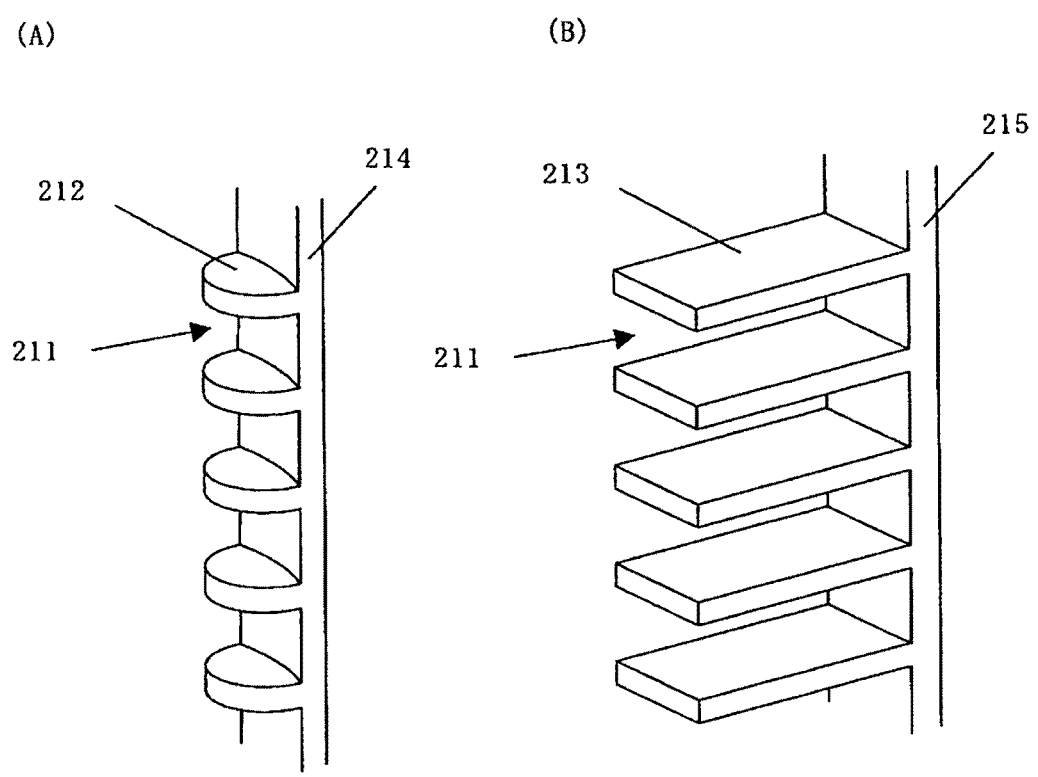
FIG. 7 is schematic views showing a wafer support portion in the conventional vertical heat treatment boat.

First, giving a description on a conventional wafer support jig, the support surface is processed based on grinding or sandblasting and a streak or a dent is formed on the support surface as explained above. Therefore, in such a conventional support surface, skewness $R_{sk}$ takes a negative value as shown in FIG. 2. At this time, friction or adhesion between the wafer support jig and a treatment target wafer that is mounted and supported on the wafer support jig becomes relatively large.

In general, at the time of performing a heat treatment to the treatment target wafer, although the treatment target wafer is thermally deformed when, e.g., a heat treatment temperature is increased or decreased, alleviation of deformation cannot due to such as slide of the treatment target wafer on the wafer support jig is no longer sufficient in some cases. That is, a stress that obstructs thermal deformation is produced in the treatment target wafer, and slip dislocation and others occur.

In a conventional wafer support jig, since friction or adhesion between the treatment target wafer and the wafer support jig is large, slide is not good, whereby slip dislocation is apt to occur.

Thus, the present inventor has studied about $R_{sk}$ on the support surface in more detail, and the inventor has thereby discovered that friction or adhesion between the treatment target wafer and the wafer support jig can be considerably reduced as compared with a conventional example when $R_{sk}$ on the support surface 11 is larger than 0, namely, it is a positive value like the wafer support jig 3 according to the present invention. Therefore, such a wafer support jig 3 according to the present invention can effectively prevent occurrence of slip dislocation that is caused due to friction or adhesion between the treatment target wafer and the wafer support jig.

On the other hand, when $R_{sk}$ on the support surface 11 is too large, namely, it is equal to or above 10, contact between the treatment target wafer and the wafer support jig becomes too small, stress concentration is produced due to a weight of the wafer itself, and slip dislocation occurs. Therefore, the support surface having $R_{sk}$ being set to be less than 10 must be adopted.

As a result, a range of a value of $R_{sk}$ on the support surface 11 of the wafer support jig 3 according to the present invention is $0 < R_{sk} < 10$.

Since $R_{sk}$ on the support surface 11 falls within the appropriate range in this manner, occurrence of slip dislocation, due to small friction or adhesion between the treatment target wafer and the wafer support jig or a small contact range of the treatment target wafer and the wafer support jig, can be considerably suppressed. As a result, a quality of the treatment target wafer subjected to the heat treatment can be improved, and a yield ratio can be enhanced.

It is to be noted that, when obtaining $R_{sk}$, Form Talysurf Intra (a stylus type surface roughness measuring instrument: manufactured by Taylor Hobson) can be used, for example.

Figure 8:
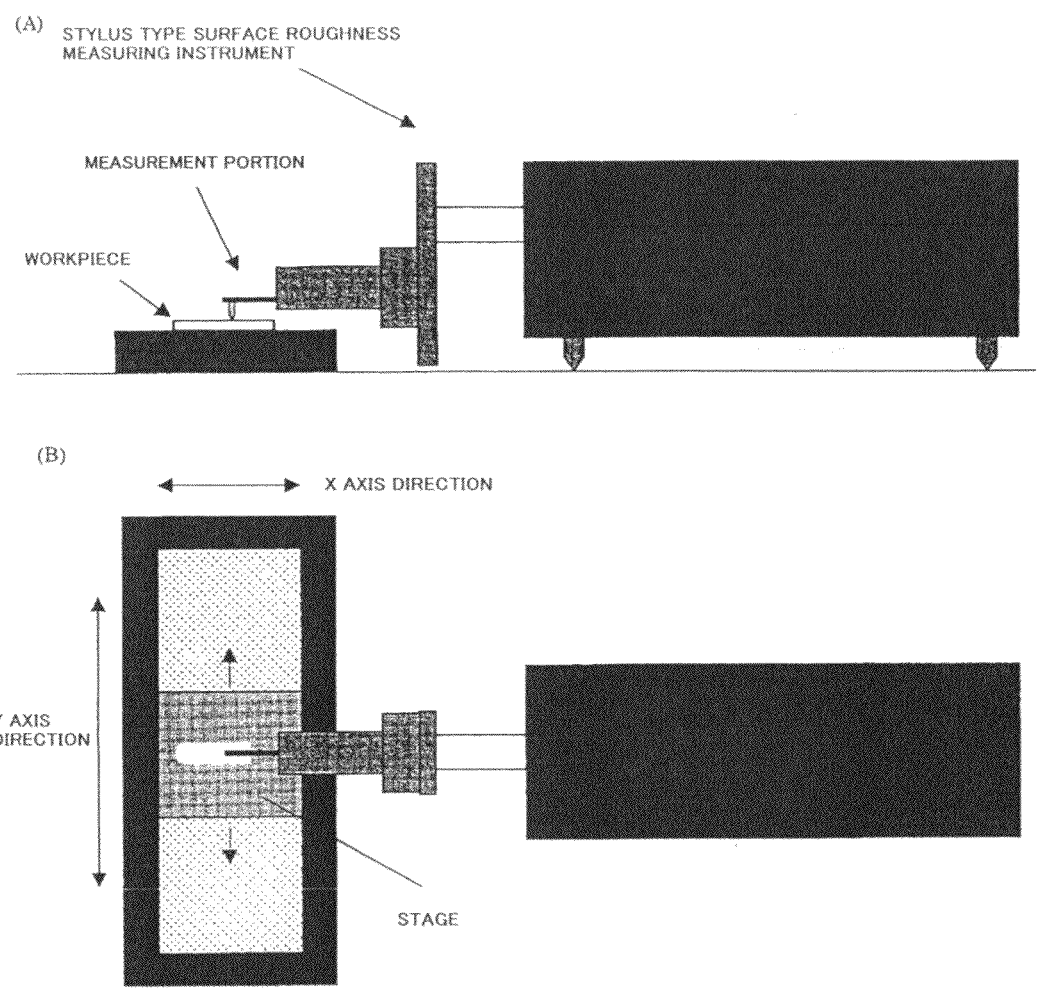
FIG. 8 is explanatory views for explaining a method for measuring a surface shape by using a stylus type surface roughness measuring instrument, where (A) is a side view and (B) is a top view.

An outline of a method for measuring a surface shape of a measurement object (a workpiece) by using Form Talysurf Intra will now be explained with reference to FIG. 8. As shown in a side view of FIG. 8(A) and a top view of FIG. 8(B), a stylus of a measuring portion is brought into contact with a surface of the workpiece on a stage to perform measurement, and moving the measuring portion in an X axis direction enables obtaining a cross-sectional curve of the surface of the workpiece (a two-dimensional mode). Further, moving the stage in a Y axis direction enables obtaining a three-dimensional curved surface of an entire surface region of the workpiece (a three-dimensional mode).

When measuring $R_{sk}$, a length of 30 mm (a length of the workpiece) is measured with a resolution of, e.g., 1 μm (although measurement is continuously performed in the X axis direction, data is fetched at intervals of 1 μm) to obtain a cross-sectional curve. The obtained cross-sectional curve is subjected to filtering (a wavelength component of 2.5 mm or above is eliminated) with a cutoff wavelength of 2.5 mm, thereby obtaining a roughness curve. $R_{sk}$ is obtained from this roughness curve, and a calculation method is defined by JIS B0601:2001.

It is to be noted that surface roughness Ra can be likewise calculated by measuring a roughness curve and using the definition.

Furthermore, the support surface 11 of the wafer support jig 3 according to the present invention has $10^0$ to $10^5$ protruding objects each having a height that is equal to or above 2 μm and less than 30 μm within arbitrary 1 mm$^2$ without protruding objects each having a height of 30 μm or above on the entire support surface.

In the wafer support jig 3 according to the present invention, since the support surface 11 has such protruding objects, and therefore the heights of the relatively large protruding objects are uniformed in each region without protruding objects that are extremely larger than the other protruding objects, and hence a stress caused due to a weight of the treatment target wafer itself is dispersed in the region, thereby suppressing occurrence of slip dislocation.

It is to be noted that Form Talysurf Intra mentioned above can be used to obtain a height or a density of each protruding object.

Here, the stage is moved in the Y axis direction to perform measurement in the three-dimensional mode. A three-dimensional curved surface of the entire region of the workpiece contact surface is obtained with an X-Y axis resolution of 2 μm (although measurement is continuously performed in the X direction, data is fetched at intervals of 2 μm. In the Y direction, the Y stage is moved at 2 μm steps). The obtained three-dimensional curved surface is filtered with a cutoff wavelength of 2.5 mm to obtain each rough curved surface. The number of protrusions each having a height of 2 μm or above is obtained from an average surface of the rough curved surface to calculate a density.

Further, although a material and others of the wafer support jig 3 are not restricted in particular, there are the following materials, for example.

As a first example, there is a material having particles that become the protruding objects (e.g., silicon carbide or silicon) dispersed and added in a base material (e.g., quartz) that is etchable by using an etchant (e.g., a liquid solution containing a hydrofluoric acid), and the protruding objects on the support surface 11 are formed by means of the dispersed and added particles by etching the base material with the etchant.

Furthermore, there is also a material in which a base material is silicon, particles dispersed and added in the base material are silicon carbide, and an etchant is a liquid solution containing a hydrofluoric acid or a nitric acid.

As a second example, a polycrystalline substance, e.g., silicon or silicon carbide is subjected to a heat treatment, and the protruding objects are formed on the support surface 11. At this time, the heat treatment is performed in a reduced-pressure atmosphere and in one of an atmosphere containing an inert gas, an atmosphere containing a hydrogen gas, and a mixed gas atmosphere containing these gases.

A method for manufacturing the wafer support jig 3 according to the present invention will now be explained.

The first example (the example using the etchant) will be first explained.

Silica-glass powder that becomes the main component of the base material for the wafer support jig 3 is prepared, and this powder is mixed with wafer and a cellulose derivative as a heat-induced gelation agent to obtain a slurry. Furthermore, silicon carbide powder or silicon powder that forms the protruding objects later is mixed. In this manner, the silicon carbide powder or the silicon powder can be uniformly dispersed and added in the base material.

It is to be noted that, although a mixing ratio of these materials is not restricted in particular, a percentage of the silicon carbide powder or the silicon powder in the base material changes depending on this mixing ratio, and this change affects, e.g., a density of the protruding objects formed on the support surface 11. Therefore, an appropriate mixing ratio can be obtained by, e.g., repeatedly conducting experiments in such a manner that a density and heights of the protruding objects, $R_{sk}$ of the support surface 11, and others fall within the ranges of the present invention. A size of each powder can be determined each time.

Subsequently, the thus prepared slurry is cooled to 10° C. or below for 1 to 120 minutes, then poured into an injection cylinder, or cooled in the injection cylinder, and subjected to injection molding in a resin or metal die heated to a temperature range from a gelation temperature of the heat-induced gelation agent to 150° C., e.g., from 70 to 120° C. Additionally, the thus obtained silica-glass molding is demolded, dried, degreased, purified, and sintered. Such processing can be carried out by a method disclosed in, e.g., Japanese Unexamined Patent Publication (Kokai) No. 2006-315910.

That is, in the degreasing processing, the molding is held in an air atmosphere at a temperature of 300 to 900° C. for 3 to 6 hours, and its temperature is lowered to a room temperature after the end of the degreasing processing.

Further, the purification processing is performed in an atmosphere containing a hydrogen chloride at 500 to 1300° C. for 0.5 to 5 hours. According to this purification processing, an aluminum concentration in the silica-glass molding can be set to 15 ppm or below, and a concentration of each of iron, calcium, sodium, potassium, and lithium can be set to 1 ppm or below, thereby manufacturing a product that can be sufficiently used in the semiconductor industry. In particular, since an alkali metal and an alkali earth metal are sufficiently purified, transition of the silica glass to cristobalite can be suppressed at the time of vitrification based on sintering, and breakage or chips due to cracks, or irregularities due to fine cracks on the surface can be prevented from being produced in the product.

It is good enough to perform sintering for vitrification at a temperature of, e.g., 1200 to 1700° C. for 5 to 30 minutes preferably under a reduced pressure.

Then, processing of grinding or the like is carried out to obtain the shape of the wafer support jig 3.

In this manner, a material having the silicon carbide powder or the silicon powder dispersed and added in the base material having quartz as a main component is etched by using a liquid solution containing a hydrofluoric acid as an etchant.

At this time, the surface of the base material having the quartz as a main component is etched by the hydrofluoric acid and, on the other hand, the silicon carbide powder or the silicon powder is hardly etched. Therefore, the silicon carbide powder or the silicon powder is exposed on the support surface 11 of the wafer support jig 3 to be formed as the protruding objects.

It is to be noted that uniformly providing the powder on the support surface is difficult when such a conventional protruding object forming method for depositing the powder on the support surface as disclosed in Japanese Unexamined Patent Publication (Kokai) No. 2002-43239 is used, and the deposited powder is removed during the heat treatment, thereby the treatment target wafer is contaminated with the particles in some cases, but the method for manufacturing a wafer support jig according to the present invention enables extremely reducing the removal of the protruding objects and uniformly dispersing and forming the protruding objects having uniform sizes without these problems.

Moreover, according to the present invention, the protruding objects can be readily formed and the skewness $R_{sk}$ on the support surface can be set to $0<R_{sk}<10$ by adjusting a particle size, an amount, and others of the silicon carbide powder or the like to be added, and the wafer support jig having $10^0$ to $10^5$ protruding objects each having a height of 2 μm or above and less than 30 μm within arbitrary 1 mm² without the protruding objects each having a height of 30 μm or above on the entire support surface can be manufactured.

It is to be noted that the base material, the particles to be dispersed and added, and the etchant used to etch the base material are not restricted, and, for example, silicon, silicon carbide, and a liquid solution containing a hydrofluoric acid and a nitric acid can be used, respectively.

A material and others of the wafer support jig 3 can be appropriately determined based on, e.g., a purpose of the heat treatment or a type of the treatment target wafer.

Furthermore, as the second example (the example based on the heat treatment), the polycrystalline substance of silicon or the silicon carbide is processed into the shape of the wafer support jig 3, and then the heat treatment is performed in, e.g., a reduced-pressure atmosphere and in one of an atmosphere containing an inert gas, an atmosphere containing a hydrogen gas, and a mixed gas atmosphere containing these gases, thereby efficiently forming the protruding objects on the support surface 11. Moreover, the wafer support jig 3 that has $R_{sk}$ falling within the same range as that mentioned above and the support surface 11 that has the protruding objects having the heights and the density falling within the same range as mentioned above formed thereon can be manufactured.

Heat treatment conditions at this time are not restricted in particular, and they can be appropriately determined by repeating experiments to obtain the $R_{sk}$ and the heights and the density of the protruding objects in the above range. For example, the present invention is not restricted to a reduced pressure, and the protruding objects can be sufficiently formed at a normal pressure in the above-described atmospheres. Moreover, the present invention is not restricted to the above-described atmospheres if the reduced pressure is applied, and the protruding objects can be formed in any other atmosphere.

Additionally, the polycrystalline substance to be subjected to the heat treatment is not restricted to the silicon or the silicon carbide. An adequate polycrystalline substance can be appropriately selected.

As explained above, according to the method for performing the heat treatment to the polycrystalline substance, the wafer support jig can be manufactured by using the single member, and higher cleanness can be easily obtained as compared with manufacture using two or more types of members.

It is to be noted that the wafer support jig 3 having such a conformation as shown in FIG. 1 has been explained here, but any wafer support jig can suffice as long as it has the support surface 11 on which the treatment target wafer is mounted and supported when performing the heat treatment, and the shape of the wafer support jig 3 is not restricted in particular. Any manufacturing method can be adopted as long as the protruding objects are formed by the etching treatment or the heat treatment and $R_{sk}$, the heights, and the density of the protruding objects in the above-described ranges can be obtained, and the molding method and others can be appropriately determined each time in accordance with the shape and others of the wafer support jig 3.

For example, the wafer support jig 3 can have a ring-like shape.

Example 1

Samples A to E

A material obtained by mixing silicon carbide powder in a slurry having silica-glass powder/water/methyl cellulose mixed therein was injected into a die to be molded, then demolded, dried, degreased, purified, sintered, and ground, thereby fabricating such a wafer support jig (a length: 30 mm) as shown in FIG. 1.

As the silicon carbide powder, powder having the greatest frequency size of 8 μm, the maximum size of 24 μm or below, and the minimum size of 3 μm or above in a size frequency distribution was used, and five types of materials having different mixing ratios were prepared.

After grinding, etching was carried out by using 10% HF for four hours to expose silicon carbide particles on a surface, thus fabricating wafer support jigs having different $R_{sk}$ values.

Table 1 shows a result of measuring a value Ra, a value $R_{sk}$, and a density of the protruding objects on each wafer support jig by using Form Talysurf Intra. Further, a protruding object having a height of 30 μm or above was not detected from all the wafer support jigs. It is to be noted that each density of the protruding objects in Table 1 concerns a situation where a height difference from an average surface on a rough curved surface obtained by three-dimensionally measuring the entire support surface region by Form Talysurf Intra is equal to or above 2 μm and less than 30 μm.

When the wafer support jigs formed of quartz was set in such a boat having a groove pitch of 7.5 mm as shown in FIG. 1, silicon wafers having a diameter of 300 mm were mounted, and a heat treatment was performed at 1200° C. for 1 hours, a slip level obtained from the evaluation using X-ray topography was as shown in Table 1.

TABLE 1

| | Ra [um] | $R_{sk}$ [—] | PROTRUDING OBJECT DENSITY [PIECES/mm²] | SLIP |
|---|---|---|---|---|
| SILICON CARBIDE MIXED SAMPLE A (GRINDING PROCESS → ETCHING) | 0.29 | 0.31 | $9.5 \times 10^4$ | ○ |
| SILICON CARBIDE MIXED SAMPLE B (GRINDING PROCESS → ETCHING) | 0.27 | 1.26 | $3.9 \times 10^3$ | ○ |
| SILICON CARBIDE MIXED SAMPLE C (GRINDING PROCESS → ETCHING) | 0.21 | 4.69 | $7.7 \times 10^1$ | ○ |
| SILICON CARBIDE MIXED SAMPLE D (GRINDING PROCESS → ETCHING) | 0.17 | 7.75 | $5.8 \times 10^0$ | ○ |
| SILICON CARBIDE MIXED SAMPLE E (GRINDING PROCESS → ETCHING) | 0.08 | 9.42 | $1.5 \times 10^0$ | ○ |

Although Ra must be set to 0.3 μm or above to avoid occurrence of slip dislocation due to, e.g., adhesion in the conventional example, it can be understood that all samples A to E can be free of slip even though Ra takes a relatively small value, i.e., 0.08 to 0.29 μm as long as $R_{sk}$ is $0 < R_{sk} < 10$ on the support surface of each wafer support jig and the wafer support jig has $10^0$ to $10^5$ protruding objects each having a height of 2 μm or above and less than 30 μm within arbitrary 1 mm² without protruding objects each having a height of 30 μm or above on the entire support surface as shown in Table 1 like the present invention.

Comparative Example 1

Samples F to H

Each quartz wafer support jig having no silicon carbide mixed therein was fabricated. Two types of wafer support jigs having different surface roughness levels were prepared, and one of them was subjected to etching after a grinding process whilst the other was subjected to a sandblast process and then etching after grinding.

Furthermore, another wafer support jig subjected to the sandblast process using a pattern and then etching was also prepared. Here, the sandblast process using a pattern is preparing a mask having holes with a diameter of 200 μm formed therein at intervals of 300 μm and then performing the sandblast process from an upper side of this mask. Effecting this processing enables forming smooth protruding objects.

Moreover, Table 2 shows a result of measuring a value Ra, a value $R_{sk}$, a protruding object density, and presence/absence of slip dislocation of each wafer support jig like Example 1.

truding object having a height of 2 μm or above was detected. Additionally, a slip level was very poor.

In a sample G having no silicon carbide, Ra was increased by the sandblast process. $R_{sk}$ at this moment took a negative value, and no protruding object having a height of 2 μm or above was detected. Even though surface roughness was increased by the sandblast process, slip dislocation was not able to be completely suppressed.

Further, in a sample H having no silicon carbide, smooth protruding objects were formed by the sandblast process using a pattern, and a density of the protruding objects was 1 piece/mm² or above, but a value $R_{sk}$ took a negative value, and a wafer completely free of slip was not able to be fabricated.

It is to be noted that protruding objects each having a height of 30 μm or above were not detected on support surfaces of the samples F to H.

As explained above, when only the conventional method of simply performing the grinding process or the sandblast process is adopted, $R_{sk}$ on the support surface of the wafer support jig takes a negative value, the protruding objects have small heights, and the support surface has an extremely large curvature, thus resulting in occurrence of adhesion with a wafer. This state is regarded as a factor that causes slip dislocation.

Furthermore, as can be understood from the sample H in particular, occurrence of slip dislocation cannot be completely prevented even though heights and a density alone of the protruding objects are defined, it was not until $R_{sk}$ also takes an appropriate value that occurrence of slip dislocation can be completely prevented. It is considered that occurrence of slip dislocation is affected by not only heights and a density of the protruding objects but also shapes of the protruding

TABLE 2

| | Ra [um] | $R_{sk}$ [—] | PROTRUDING OBJECT DENSITY [PIECES/mm²] | SLIP |
|---|---|---|---|---|
| SAMPLE F CONTAINING NO SILICON CARBIDE (GRINDING PROCESS → ETCHING) | 0.12 | −0.25 | $0.0 \times 10^0$ | XX |
| SAMPLE G CONTAINING NO SILICON CARBIDE (SANDBLAST PROCESS → ETCHING) | 0.67 | −0.43 | $0.0 \times 10^0$ | X |
| SAMPLE H CONTAINING NO SILICON CARBIDE (SANDBLAST PROCESS → ETCHING) | 0.80 | −0.27 | $9.3 \times 10^0$ | X |

A sample F having no silicon carbide in Comparative Example 1 is a product subjected to the grinding process and has a small value Ra and a negative value $R_{sk}$, and no proobject, and it can be understood that $R_{sk}$ is also a parameter that is effective to define the protruding objects that do not cause slip dislocation.

Comparative Example 2

Samples I and J

Silicon carbide was mixed in a slurry having silica-glass powder/water/methyl cellulose mixed therein to fabricate a wafer support jig having very many protruding objects (a silicon carbide mixed sample I) and a wafer support jig having a very few protruding objects (a silicon carbide mixed sample J) (see Table 3). Protruding objects each having a height of 30 μm or above were not detected from these wafer support jigs.

TABLE 3

| | Ra [um] | $R_{sk}$ [—] | PROTRUDING OBJECT DENSITY [PIECES/mm²] | SLIP |
|---|---|---|---|---|
| SILICON CARBIDE MIXED SAMPLE I (GRINDING PROCESS → ETCHING) | 0.42 | −0.45 | $6.5 \times 10^5$ | X |
| SILICON CARBIDE MIXED SAMPLE J (GRINDING PROCESS → ETCHING) | 0.13 | 11.31 | $0.5 \times 10^0$ | XX |

According to the silicon carbide mixed sample I, since the number of the protruding objects was too large, a value $R_{sk}$ took a negative value. Friction/adhesion between the wafer and the wafer support jig were not greatly reduced, and a slip level was poor.

According to the silicon carbide mixed sample J, since the number of silicon carbide particles was too small, a value $R_{sk}$ took a value 10 or above. In this case, stress concentration due to a weight of the wafer itself occurred, and a slip level was poor.

When a density of the protruding objects on the support surface is out of the range of $10^0$ to $10^5$ pieces/mm² and a value $R_{sk}$ is also out of the range of $0<R_{sk}<10$ as explained above, slip dislocation cannot be suppressed.

Comparative Example 3

A reaction-sintered silicon carbide impregnated with Si was used to fabricate a wafer support jig, and silicon carbide CVD coating was effected.

It is to be noted that, as a result of the same measurement as that in Example 1, Ra was 0.92 μm, $R_{sk}$ was 4.7, and a density of the protruding objects was $4.9 \times 10^1$ pieces/mm². However, many protruding objects generated due to abnormal growth were produced on a surface of the silicon carbide CVD coat, and a small number of extremely large protruding objects were present among these protruding objects.

Specifically, five protruding objects each having a height of 30 μm or above were detected.

When the same heat treatment as that in Example 1 was effected by using this wafer support jig, strong slip was detected from a treatment target wafer in the X-ray topography evaluation. Such slip used each of some protruding objects having heights of 30 μm or above as a starting point.

When the protruding objects that are extremely larger than the other protruding objects are present as explained above even though the value $R_{sk}$ on the support surface or the density of the protruding objects falls within the range according to the present invention, stress is concentrated on a treatment target wafer with such protruding objects being determined as starting points, thereby resulting in occurrence of slip dislocation.

Example 2

In the same wafer support jig as that fabricated in Comparative Example 3, the five protruding objects having the heights of 30 μm or above were all ground down.

Slip dislocation was evaluated like Example 1, and slip dislocation was no longer detected.

Example 3

A wafer support jig made of polycrystal silicon was fabricated by grinding.

At this time, there was no protrusion having a height of 2 μm or above, Ra was 0.16 μm and $R_{sk}$ was −0.10.

When this wafer support jig was annealed in an argon gas atmosphere at a reduced pressure and 1250° C. for 100 hours, Ra was 0.24 μm, $R_{sk}$ was 0.95, and a density of protruding objects each having a height of 2 μm or above and less than 30 μm was $1.5 \times 10^3$ pieces/mm² within arbitrary 1 mm². Further, there was no protruding object having a height of 30 μm or above on the entire support surface, namely, the wafer support jig according to the present invention was obtained.

When this wafer support jig was used to perform the same heat treatment as that in Example 1, slip dislocation was not detected in the X-ray topography evaluation.

Comparative Example 4

Two types of polycrystal silicon wafer support jigs having different surface roughness levels were fabricated.

One of them was subjected to the grinding process and had Ra of 0.14 μm, $R_{sk}$ of −0.16, and no protrusion having a height of 2 μm or above. The other was subjected to the grinding process and then the sandblast process and had Ra of 0.62 μm, $R_{sk}$ of −0.41, and no protruding object having a height of 2 μm or above.

When this wafer support jig was used to perform the same heat treatment as that in Example 1, both the wafer support jigs had poor slip levels.

It is to be noted that the present invention is not restricted to the foregoing embodiment, the foregoing embodiment is just an exemplification, and any examples that have substantially the same structures and the same functions and effects as the technical concept described in claims according to the present invention are included in the technical scope of the present invention.

The invention claimed is:

1. A method for manufacturing a wafer support jig on which a treatment target wafer is mounted and supported on a support surface when performing a heat treatment, comprising:

performing a heat treatment in one of an atmosphere containing an inert gas, an atmosphere containing a hydrogen gas, and a mixed gas atmosphere containing these gases to a polycrystalline substance that becomes a base material for the wafer support jig to form protruding objects on the support surface;

setting skewness $R_{sk}$ on the support surface to $0<R_{sk}<10$; and manufacturing a wafer support jig that has $10^0$ to $10^5$ protruding objects each having a height of 2 μm or above and less than 30 μm within arbitrary 1 mm² without protruding objects each having a height of 30 μm or above on the entire support surface.

2. The method for manufacturing a wafer support jig according to claim 1, wherein the heat treatment for the polycrystalline substance is performed in a reduced-pressure atmosphere.

3. The method for manufacturing a wafer support jig according to claim 1, wherein the polycrystalline substance to be subjected to the heat treatment is a polycrystalline substance of silicon or silicon carbide.

4. The method for manufacturing a wafer support jig according to claim 2, wherein the polycrystalline substance to be subjected to the heat treatment is a polycrystalline substance of silicon or silicon carbide.

* * * * *